United States Patent [19]

Yasuda et al.

[11] Patent Number: 4,845,399
[45] Date of Patent: Jul. 4, 1989

[54] LAMINATED PIEZOELECTRIC TRANSDUCER

[75] Inventors: Eturo Yasuda; Hiroshi Matsuoka, both of Okazaki; Hiroyuki Yoshida, Nishio; Yoichi Kotanshi, Okazaki; Yasushi Sawada, Aichi, all of Japan

[73] Assignee: Nippon Soken, Inc., Nishio, Japan

[21] Appl. No.: 255,997

[22] Filed: Oct. 11, 1988

Related U.S. Application Data

[62] Division of Ser. No. 89,408, Aug. 26, 1987, Pat. No. 4,803,763.

[30] Foreign Application Priority Data

Aug. 28, 1986 [JP] Japan ................................ 61-200111
Dec. 18, 1986 [JP] Japan ................................ 61-302297

[51] Int. Cl.$^4$ ............................................ H01L 41/08
[52] U.S. Cl. ................................... 310/366; 310/328; 310/363; 310/365; 310/369
[58] Field of Search ............... 310/328, 365, 366, 364, 310/363, 369, 358, 359

[56] References Cited

U.S. PATENT DOCUMENTS 4,803,763  2/1989  Eturo et al. ................... 310/359 X

FOREIGN PATENT DOCUMENTS 0176282  9/1985  Japan ................................ 310/366
0142780  6/1986  Japan ................................ 310/366
0182284  8/1986  Japan ................................ 310/366

Primary Examiner—Mark O. Budd
Attorney, Agent, or Firm—Cushman, Darby & Cushman

[57] ABSTRACT

A laminated piezoelectric transducer, comprising a laminate of a plurality of piezoelectric plates with paste electrodes inserted therebetween and bonding the plates together. Rows of metal extrusions are made by electroless plating onto the paste electrodes on the peripheral outer surface of the laminate. Each row of the metal extrusions is formed onto and electrically connected to alternate paste electrodes, so that by electrically connecting each row of the metal extrusions, the laminate of the piezoelectric plates is electrically connected in parallel. This laminated piezoelectric transducer allows the formation of the paste electrodes on the entire or at least substantially the entire main surfaces of the piezoelectric plates, and eliminates the need for the usual metal plate electrodes inserted between the piezoelectric plates.

9 Claims, 4 Drawing Sheets

LAMINATED PIEZOELECTRIC TRANSDUCER

This is a division of application Ser. No. 089,408, filed Aug. 26, 1987, now U.S. Pat. No. 4,803,763, issued Feb. 14, 1982.

BACKGROUND OF THE INVENTION

1. Field of the Invention

The present invention relates to a laminated piezoelectric transducer, more specifically, to a laminated piezoelectric transducer formed by laminating a number of piezoelectric plates, which laminated expands and contracts upon application of an electrical voltage and can be used as an actuator.

2. Description of the Related Art

Known in the prior art is a laminated piezoelectric transducer actuator wherein piezoelectric plates and metal electrode plates having extrusions in three directions are alternatively laminated, the extrusion extruding from the laminate of the piezoelectric plates. In this actuator, the metal electrode plates are connected at the extrusions in parallel by outer leads or outer electrodes, and these metal electrode plates and metal coatings formed on the main surfaces of the piezoelectric plates are made within the main surfaces of the piezoelectric plates and apart from the periphery of the piezoelectric plates, to prevent a short circuit caused by contact between the side leads and the metal electrode plates or the metal coatings having opposite potentials (see, for example, Japanese Unexamined Patent Publication (Kokai) No. 60-4279 and U.S. Pat. No. 4,011,474 to O'Neill).

Recently, such actuators are often used for high load operations. This necessitates an actuator having electrodes covering the entire surfaces of piezoelectric plates, to ensure an effective utilization of the entire area of the piezoelectric plates or the actuator, and from the viewpoint that the coexistence of a loaded portion and a portion not under a load should be avoided.

Further, to lower the cost of a drive circuit, the voltage to be applied should be lowered, but if the thickness of piezoelectric elements or plates is reduced for this purpose, the mechanical strength of the piezoelectric plates is decreased to an extent such that a laminate of such thin piezoelectric plates having metal electrode plates inserted therebetween, will split.

SUMMARY OF THE INVENTION

The present invention provides a laminated piezoelectric transducer, comprising: a laminate of a plurality of piezoelectric plates; paste electrodes disposed between and bonding the piezoelectric plates together; first and second rows of metal extrusions made by electroless plating to the past electrodes extruding from the laminate at portions of the peripheral outer surface of the laminate, the first and second rows of metal extrusions being separated in the direction of the periphery of the laminate and electrically connected to different alternate paste electrodes respectively; and first and second outer electrodes electrically connecting each of the first and second rows of the metal extrusions respectively.

The present invention also provides a process for manufacturing a laminated piezoelectric transducer, comprising the steps of: forming a laminate of a plurality of piezoelectric plates and paste electrodes, the paste electrodes being disposed between and bonding the piezoelectric plates together; electrolessly plating the paste electrodes to make first and second rows of metal extrusions extruding from the laminate at portions of the peripheral outer surface of said laminate, the first and second rows of the metal extrusions being separated in the direction of the periphery of the laminate and electrically connected to different alternate paste electrodes respectively; and electrically connecting the metal extrusions to each other in each row of the first and second rows.

In this laminated piezoelectric transducer, the usual metal electrode plates between the piezoelectric plates are omitted and paste electrodes, i.e., inner electrodes, are formed to cover the entire or substantially the entire main surfaces of the piezoelectric plates. To allow the inner electrodes to be electrically connected to each other in parallel, an electroless plating for forming metal extrusions is carried out onto portions of the paste electrodes on the peripheral outer surface of the laminate of the piezoelectric plates and the paste electrodes. The methods for selectively forming the metal extrusions onto the laminate are described later in detail, but are not limited thereto. If desired, an insulating layer may be formed to cover the peripheral outer surface of the laminate between the metal extrusions in each row, to insulate the inner electrodes inside the insulating layer from outside contact.

In a preferred embodiment of the present invention, the metal extrusions in each row are lapped to provide substantially evenly flat top surfaces. This enables an electrical connection of a flat side lead to all metal extrusions of a row. Further, by providing metal plates fixed to an insulating plate which are bonded to ends of the laminate of the piezoelectric plates and the paste electrodes, the side leads connecting the extrusions and outer leads connected to a power source can be firmly fixed to the metal plates and are resistant to disconnection.

BRIEF DESCRIPTION OF THE INVENTION

FIGS. 13A and 14B shows different types of side leads;

DESCRIPTION OF THE PREFERRED EMBODIMENTS

Figure 1:
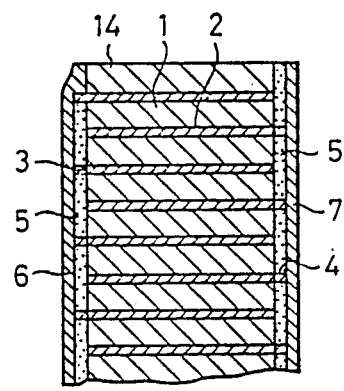
FIG. 1 is a sectional view of a laminated piezoelectric transducer according to the present invention.

FIG. 1 illustrates an example of a laminated piezoelectric transducer according to the present invention. In the figure, the reference numeral 1 denotes piezoelectric plates, the reference numeral 2 inner electrodes or paste electrodes bonding the piezoelectric plates 1 together to form a laminate, the reference numeral 3 a first row of metal extrusions made by plating on the side of alternate paste electrodes 2, the reference numeral 4 a second row of metal extrusions made by plating on the side of other alternate paste electrodes 2, the reference numeral 5 an insulating layer, and the reference numerals 6 and 7 outer electrodes or side leads.

Figure 2:
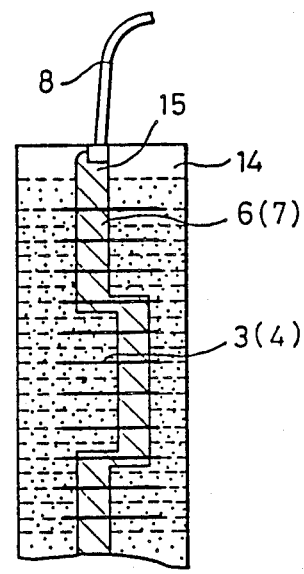
FIG. 2 is a side view of the laminated piezoelectric transducer in FIG. 1.

FIG. 2 is a side view of the laminated piezoelectric transducer of FIG. 1. As seen in FIG. 2, the outer electrode 6 or 7 is formed in the row of the metal extrusions 3 or 4 in the form of a zigzag and an outer lead 8 to be connected to a power source (not shown) is connected to the outer electrodes 6 or 7.

As seen in FIGS. 1 and 2, outer electrodes 6 and 7 are connected to metal extrusions 3 and 4 extended from each of the alternate paste electrodes 2 to electrically connect the piezoelectric elements of the laminate in parallel. A short circuit of the outer electrode 6 or 7 with any of the paste electrodes 2 having an opposite potential to that of the outer electrode is prevented by forming an insulating layer 5 therebetween. In this example, the first and second rows of metal extrusions 3 and 4 actually form one row respectively on opposite sides, but alternatively, they may be a plurality of rows.

The process for manufacturing such a laminated piezoelectric transducer is described below.

Figure 3:
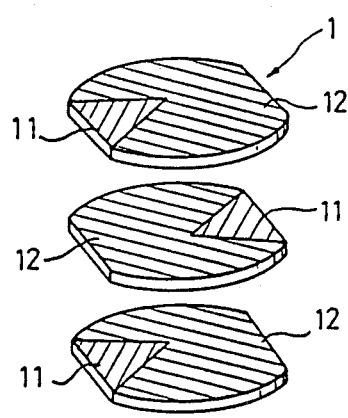
FIG. 3 is a perspective view of piezoelectric plates having electrode portions thereon.

Referring to FIG. 3, shaped ceramic green sheets of, e.g., PZT, are fired, followed by grinding the peripheries and lapping the main surfaces thereof to form piezoelectric plates (e.g., 0.3 mm) 1. Electrode paste is screen printed onto the piezoelectric plates 1, to form inner paste electrodes 2. The piezoelectric plates 1 are in the shape of a disc having a diameter of 15 mm, in which opposite parts of the periphery are cut to form parallel side planes whereat the metal extrusions are to be formed and outer electrodes connected thereto. The paste electrodes 2 are formed of two kinds of metal paste, in two patterns 11 and 12. The pattern 11 is made of a silver paste containing palladium (or Fe, Co, Ni, Ru, Os, Ir, Pt or the like) mixed therein in an amount of 5 to 35% by weight. The another pattern 12 is made of a silver paste containing lead (or Sb, Sn, Zn or the like) mixed therein an amount of 5 to 30% by weight. The pattern 11 extends to and is in contact with the periphery of the piezoelectric plate 1 whereat the metal extrusions are to be formed, i.e., at one of the side parallel planes cut from the disc, and the pattern 12 extends to and is in contact with the rest of the periphery of the piezoelectric plate 1.

The piezoelectric plates 1 with the printed paste electrode patterns 11 and 12 formed thereon are dried at 100° C. and then laminated in a predetermined number such that, as seen in FIG. 3, the pattern 11 is repeated on every other piezoelectric plate 1. The laminate is heated under a load of 1 kg/cm$^2$ in an oxygen-containing atmosphere to fuse the metal paste. This heat treatment causes the piezoelectric plates 1 to be bonded together by fusion of a glass contained in the metal paste.

The laminate bonded together is then subject to electroless plating by one of the methods described below.

In one method, the laminate is cleaned with a sold alkaline cleaning solution followed by rinsing with water, then dipped in an aqueous chloric acid solution (1:1) for 1 to 2 minutes and again rinsed with water, and then dipped in a sodium hypophosphite solution at about 80° C. for 10 minutes. The laminate is then dipped in a sold electroless plating solution S-680 or S-780 (product of Nippon Kanizen) at about 90° C. until metal extrusions 3 and 4 having a height of 50 to 100 μm are formed.

In a second method, portions of the laminate where electroless plating is not desired are masked with a teflon tape or the like and portions of the laminate to be electroless plated are selectively exposed. Then, the laminate is cleaned with a sold alkaline cleaning solution followed by rinsing with water, dipped in an aqueous chloric acid solution (1:1) for 1 to 2 minutes followed by rinsing with water, and then dipped in an activating solution No. 3 (product of Nippon Kanizen) at about 60° C. for 10 minutes followed by rinsing with water. The laminate is again dipped in an aqueous chloric acid solution (1:1) for 1 to 2 minutes followed by rinsing with water, dipped in a sodium hypophosphite solution at about 80° C. for about 10 minutes, and then dipped in an electroless plating solution SB-55 (product of Nippon Kanizen) at about 65° C. for about 10 minutes, followed by rinsing with water. The laminate is then dipped in an electroless plating solution S-780 (product of Nippon Kanizen) at about 90° C. until metal extrusions 3 and 4 having a height of 50 to 100 μm are formed. After the electroless plating is completed, the mask is removed. In the above, the electroless plating solutions are not limited to the above examples, and any commercially available electroless plating solutions may be used.

Figure 4:
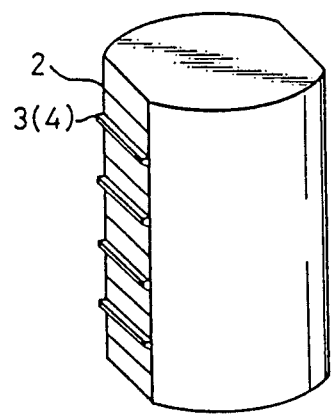
FIG. 4 is a perspective view of a laminate of the piezoelectric plates on which metal extrusions are formed by electroless plating.

As shown in FIG. 4, the electroless plating forms plated nickel portions or the metal extrusions 3 and 4 on alternate edges of the paste electrodes appearing at each of the parallel side planes of the laminate. The height of the metal extrusions 3 and 4 are preferably in a range of 50 to 100 μm. In the electroless plating, nickel is easily deposited onto the portions of the pattern 11 since it is activated by palladium, but is difficult to deposit onto the portions of the pattern 12 since the lead content thereof acts as a catalyst, thus resulting in a selective plating as shown in FIG. 4.

Figure 5:
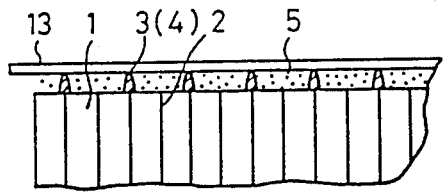
FIG. 5 is a sectional partial view of the laminate on which an insulating layer is coated.

At each of the parallel side planes of the laminate, the paste electrodes 2 onto which the metal extrusions 3 or 4 are not formed should be preferably insulated from the metal extrusions 3 or 4, because of the opposite electrical potentials thereof. To this end, referring to FIG. 5, a plate 13 is placed on a row of the metal extrusions 3(4) and a resin is cast under the plate and cured. The plate 13 is then removed and an insulating layer 5 remains between the metal extrusions 3(4). The resin is preferably selected from heat resistant and flexible resins which can endure repeated elongation and contraction, for example, epoxy, silicone, fluorosilicone resins, etc.

Referring again to FIG. 2, after the plate 13 is removed, the exposed tips of the metal extrusions 3 and 4 are electrically connected by printing a conductor paste strip onto the insulating layer 5, including the tips of the metal extrusions 3(4), to form the outer electrodes 6 and 7. To connect the outer leads to the laminate, piezoelectric plates (dummy plates) 14 adhered to the laminate at both ends thereof and not having electrodes therefor, are used. Silver paste 15 is fused onto the dummy plates 14, and the outer electrodes 6 and 7 are connected and outer leads 8 are soldered thereto. Then, the entire peripheral outer surface of the laminate is covered with a resin coating (not shown) to insulate the outer electrodes 6 and 7, etc., from a metal container or case (not shown). The outer electrodes 6 and 7 may be straight but preferably are in the form of a zigzag, as shown in FIG. 2, when a high deviation of the piezoelectric elements is expected.

In the above example, inner paste electrodes are composed of a material activating the electroless plating and another material acting as a catalyst to the electroless plating, to ensure a selective deposition, but the prevent invention is not limited to this process.

Figure 6:
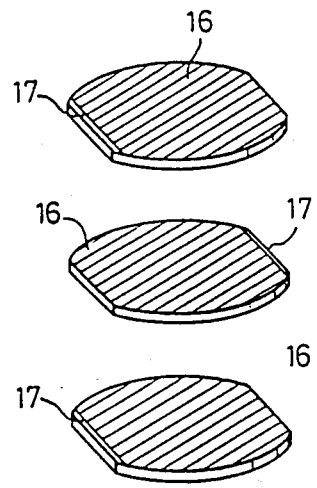
FIGS. 6 to 8 are perspective views of various embodiments of piezoelectric plates having an electrode paste applied thereon.

For example, referring to FIG. 6, silver paste or silver-palladium paste 16 may be coated, for example, by screen printing, on the entire main surfaces of the piezoelectric plates 1, except for the portions 17 of the periphery of the piezoelectric plates 1 where plating should not be deposited adjacent to the parallel side planes. At the portions 17, the paste 16 is slightly away from the periphery. Since width of the portions 17, i.e., the distance from the periphery to the paste 16, can be as little as 0.1 mm or less, the advantages of the entire surface electrodes according to the present invention are not lost.

Alternatively, an electrode pattern as shown in FIG. 6 may be formed by silver paste, etc., having different fusion temperatures. For example, referring to FIG. 7, a pattern 18 is made of a silver paste having a fusion point of 540° C. and another pattern 19 is made of a silver paste having a fusion point of 800° C. When firing at 800° C., the pattern 18 contracts because the glass content of the silver paste has a fusion point of 540° C. and then contracts.

Alternatively, a silver paste having a silver content of 80 to 90% by weight is used for portions where plating should occur, and a silver paste having a silver content of about 60% by weight is used where plating should not occur.

Figure 7:
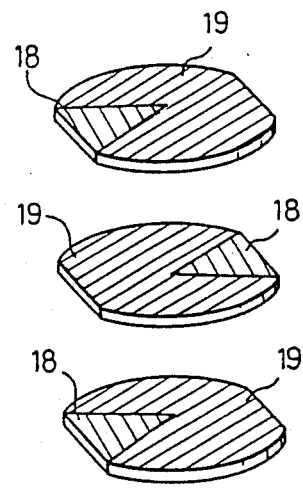

When the paste patterns as shown in FIGS. 6 and 7 are used, the peripheral outer surface of the laminate except for the parallel side planes where the metal extrusions are to be formed should be coated with a resin, etc., before electroless plating to prevent deposition of the metal onto the peripheral outer surface.

Figure 8:
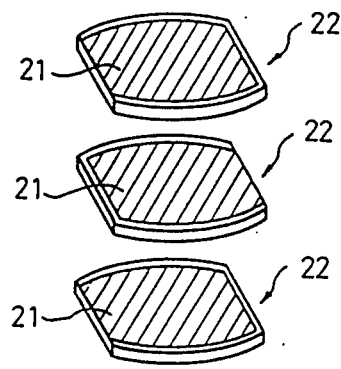

This coating of a part of the peripheral outer surface of the laminate with a resin, etc., may be eliminated in case of FIG. 3 or FIG. 8. Referring to FIG. 8, a silver paste 21 is screen printed onto almost the entire main surfaces of piezoelectric plates 22. The silver paste 21 extends to and is in contact with only the periphery of the piezoelectric plates 22 where metal extrusions are to be formed and the silver paste 21 is slightly away from the rest of the periphery of the piezoelectric plates 22. The distance from the periphery of the piezoelectric plate 22 to the silver paste 21 is in a range of 0.1 to 0.3 mm. The subsequent procedure is similar to that described with reference to FIGS. 3 to 5.

Figure 9:
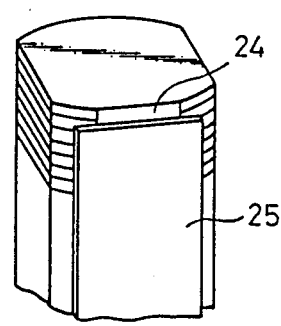
FIG. 9 is a perspective view of a laminate during accelerated electroless plating.

Here, if the speed of electroless plating is to be increased, the following procedure may be utilized. Referring to FIG. 9, a part 24 of the peripheral outer surface of the laminate is ground flat and expose the paste electrodes thereat. A metal plate 25 is bonded to the part 24 with an adhesive metal paste, whereby each paste electrode is electrically connected with the metal plate 25. This metal plate 25 is used to accelerate the plating speed. After the formation of the metal extrusions, the metal plate 25 is removed and a part 24 of the laminate is lapped to remove the adhesive metal paste. This procedure may be also used in any of the preceding examples.

Although in the above examples, silver plating is used, another plating such as copper or zinc plating may be used, and instead of the triangular pattern shown in FIGS. 3 and 7, another pattern, e.g., rectangular, may be used.

Further, the outer electrodes of the printed conductor strips may be omitted and the side heads connected directly to the metal extrusions.

Another preferred example of a laminated piezoelectric transducer is now described with reference to FIG. 10.

Figure 10:
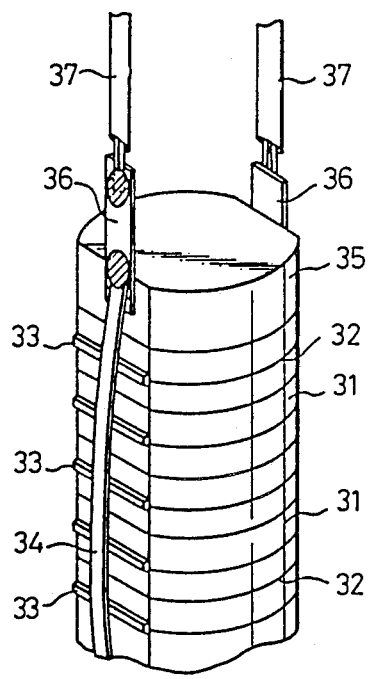
FIG. 10 is a perspective view of another embodiment of a laminated piezoelectric transducer according to the present invention.
Figure 11:
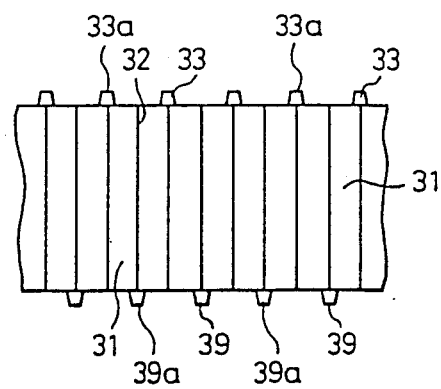
FIG. 11 is a front view of a part of the laminated piezoelectric transducer shown in FIG. 10.

In FIG. 10, reference numeral 31 denotes piezoelectric plates; 32 inner electrodes or paste electrodes; 33 metal extrusions, 34 side leads; 35 insulating plates dummy plates 1 arranged at both ends of the laminate of the piezoelectric plates 31 and the paste electrodes 32; 36 metal plates which are fixed to the dummy plate 35 and to which an end of the side lead 34 is electrically connected; and 37 outer leads electrically connected to the metal plates 36.

In this embodiment, the top surfaces of the metal extrusions 33 are lapped to a substantially even flat surface in each row. This enables a firm and reliable connection of the side leads 34 to the metal extrusions 33, since, after plating, the metal extrusions 33 may have uneven and round top surfaces which may sometimes result in bad or incomplete mechanical and electrical connections between the side leads 34 and the metal extrusions. Moreover, the metal plates 36 firmly fixed to the dummy plates 35 prevent the connection of the side leads 34 to the metal extrusions 33 from breakage or damage even if an outer force is applied to the outer leads 37, because of the outer leads 37 are not directly connected to the side leads 34. Further, the connection of a side leads to the metal extrusions may be easily and quickly carried out.

In the manufacturing process, the lamination of the piezoelectric plates 31 and the paste electrodes 32, as well as the electroless plating, may be carried out in the same way as described before.

After the electroless plating, referring also to FIGS. 11 to 14, the metal extrusions 33 and 39 of the first and second rows are lapped to substantially even flat surfaces 33a and 39a, and the laminate is then rinsed with water and dried. The side leads 34 are then connected as described below.

Figure 12A:
FIGS. 12A and 12B show a side lead before forming and a side lead after forming, respectively.
Figure 12B:
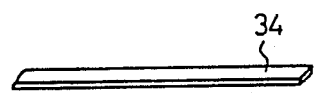

The laminate is dipped in a flux and then passed through a solder adjusted to 250° C. to coat the surfaces of the metal extrusions 33 and 39 with a film of the solder. The side leads 34 are formed by applying a pressure to a line 34a, as shown in FIG. 12A, from opposite sides to form a flat lead 34 as shown in FIG. 12B. The flat side leads 34 are also dipped in a flux and passed through a fused solder, to coat the side leads 34 with a film of the solder. This side leads 34 are placed on the metal extrusions 33 of each row and pressed by a metal member heated to 250° C., whereby the solder is fused and bonds the side lead 34 to the metal extrusions 33 of the row.

Figure 14:
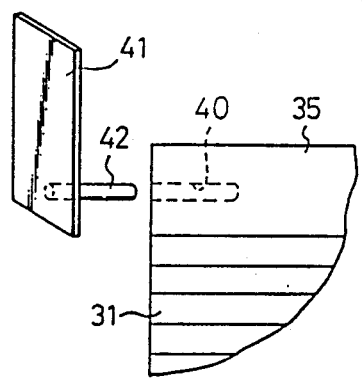
FIG. 14 shows a part of the laminate to which a metal plate is to be fixed.

To the ends of this laminate with the side leads 34 are bonded dummy plates 35 having the same shape as and a thickner thickness than those of the piezoelectric plates 31. Referring to FIG. 14, holes 40 having a diameter of about 1 mm are formed in the opposite side planes of the dummy plates 35. The metal plates 41 are made of a conductive metal and have a rectangular shape, and a metal pin 42 having a diameter of about 1 mm is spot-welded thereto. The pin 42 is inserted into and bonded to the holes 40 of the dummy plates 35 with an adhesive. An end of the side leads 34 is fixed to the metal plates 41 fixed to the dummy plates 35, for example, by soldering.

Then, the laminate with the metal plates 41 is placed in a mold having a releasing agent applied on the inside surface thereof, and an adhesive expoxy resin, silicone, fluorosilicone, or the like is poured into a space between the inside surface of the mold and the peripheral outer surface of the laminate, to form an electrical insulating layer on the peripheral outer surface of the laminate. This insulating layer is formed between the metal extrusions 33 or 39 in each of the first and second rows to insulate the paste electrodes 32 between the metal extrusions 33 or 39 from the metal extrusions 33 or 39.

Figure 13A:
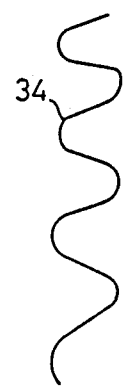
Figure 13B:
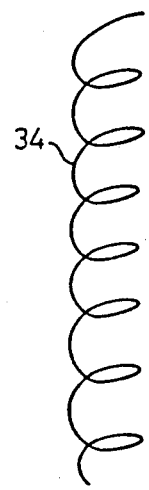

The side leads 34 may be in the straight flat shape as shown, or in a line in the form of a zigzag as shown in FIG. 13A, or in a spiral as shown in FIG. 13B.

Figure 15:
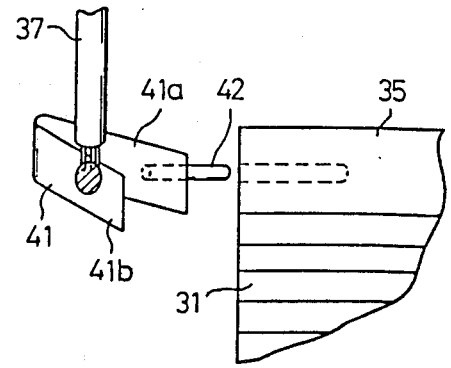
FIG. 15 shows a part of the laminate to which another metal plate is to be fixed.

The metal plates 41 may be a folded metal band as shown in FIG. 15. The folded metal band 41 comprises a part 41a to which a pin 42 is spot-welded, the pin 42 being then fixed to the dummy plate 35, and to which a side lead 34 is also connected by soldering, etc., and another part 41b to which an outer lead 37 is connected by soldering, etc. In this configuration, the metal plates 41 are flexible, so that any external force on the outer leads 37 is absorbed by this flexible metal plate 41.

We claim:

1. A laminated piezoelectric transducer, comprising:
   a laminate of a plurality of piezoelectric plates;
   paste electrodes disposed between and bonding together said piezoelectric plates;
   first and second rows of metal extrusions made be electroless plating onto said pasted electrodes extruding from said laminate at portions of the peripheral outer surface of said laminate, said first and second rows of the metal extrusions being separated in the direction of the periphery of said laminate and electrically connected to different alternative paste electrodes respectively; and
   first and second outer electrodes electrically connecting each of said first and second rows of said metal extrusions respectively.

2. A transducer according to claim 1, further comprising a first insulating layer covering peripheral outer surface of said laminate at least between said metal extrudes of each of said first and second rows to insulate said paste electrodes beneath said insulating layer from outside contact.

3. A transducer according to claim 1, wherein said paste electrodes are formed onto entire main surfaces of said piezoelectric plates.

4. A transducer according to claim 3, wherein said paste electrodes are composed of a first pattern made of a first material assisting the electroless plating of said metal extrusions and a second pattern made of a second material which is a catalyst poison against the electroless plating of said metal extrusions, said first pattern extending to a portion of the peripheral outer surface of said laminate where said metal extrusions are formed, and said second pattern extending to a portion of the peripheral outer surface of said laminate where said metal extrusions are not formed, in axial strip areas formed by each of said first and second rows of said metal extrusions.

5. A transducer according to claim 1, wherein said paste electrodes have a pattern extending to a portion of the peripheral outer surface of said laminate where said metal extrusions are formed and extending to a position slightly inside the peripheral outer surface of said laminate where said metal extrusions are not formed, in axial strip areas formed by each of said first and second rows of said metal extrusions.

6. A transducer according to claim 1, wherein said paste electrodes are composed third and fourth patterns, said third pattern being made of third material having a first fusion temperature and extending to a portion of the peripheral outer surface of said laminate where said metal extrusions are formed, said fourth pattern being made of a fourth material having a second fusion temperature substantially lower than said first fusion temperature and extending to a position slightly inside the peripheral outer surface of said laminate where said metal extrusions are not formed, in axial strip areas formed by each of said first and second rows of said metal extrusions.

7. A transducer according to claim 1, wherein said first and second outer electrodes are a conductor strip printed on tips of each of said first and second rows of said metal extrusions and on said first insulating layer between said metal extrusions.

8. A transducer according to claim 7, further comprising a second insulating layer covering the entire outer surface of said laminate including said outer electrodes.

9. A laminated piezoelectric transducer, comprising:
   a laminate of a plurality of piezoelectric plates;
   paste electrodes disposed between and bonding together said piezoelectric plates;
   first and second rows of metal extrusions made by electroless plating onto said paste electrodes and extending from said laminate at a portion thereof and having top surfaces, said first and second rows of metal extrusions being separated in the direction of the periphery of said laminate and electrically connected to different alternate paste electrodes, the top surfaces of each row of said first and second rows of said metal extrusions being substantially even and flat;
   insulating plates bonded to both ends of said laminate;
   first and second side leads electrically connected to said first and second rows respectively of said metal extrusions;
   first and second metal plates fixed to said insulating plates, said first and second side leads being fixed at an end thereof and electrically connected to said first and second metal plates respectively; and
   first and second outer leads fixed and electrically connected to said first and second metal plates respectively.

* * * * *